(12) United States Patent
Hembree et al.

(10) Patent No.: US 6,598,290 B2
(45) Date of Patent: Jul. 29, 2003

(54) METHOD OF MAKING A SPRING ELEMENT FOR USE IN AN APPARATUS FOR ATTACHING TO A SEMICONDUCTOR

(75) Inventors: David R. Hembree, Boise, ID (US); Salman Akram, Boise, ID (US); Derek Gochnour, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/124,848

(22) Filed: Apr. 18, 2002

(65) Prior Publication Data

US 2002/0117791 A1 Aug. 29, 2002

Related U.S. Application Data

(62) Division of application No. 09/009,169, filed on Jan. 20, 1998.

(51) Int. Cl.[7] ................................................ H01R 9/00
(52) U.S. Cl. ............................ 29/845; 29/825; 29/843; 29/842
(58) Field of Search ............................ 439/66; 29/825, 29/845, 846, 830, 842; 324/755

(56) References Cited

U.S. PATENT DOCUMENTS

| | | | | |
|---|---|---|---|---|
| 3,217,283 A | * | 11/1965 | Shlesinger, Jr. | |
| 3,795,037 A | * | 3/1974 | Luttmer | |
| 4,161,346 A | * | 7/1979 | Cherian et al. | |
| 4,593,961 A | * | 6/1986 | Cosmo | |
| 4,667,154 A | | 5/1987 | Allerton et al. | |
| 4,793,814 A | * | 12/1988 | Zifcak et al. | |
| 4,870,356 A | | 9/1989 | Tingley | |
| 5,014,161 A | | 5/1991 | Lee et al. | |
| 5,014,967 A | | 5/1991 | Wolf et al. | |
| 5,140,405 A | | 8/1992 | King et al. | |
| 5,192,479 A | | 3/1993 | Harasz et al. | |
| 5,302,891 A | | 4/1994 | Wood et al. | |
| 5,324,205 A | * | 6/1994 | Ahmad et al. | |

(List continued on next page.)

OTHER PUBLICATIONS

Fjelstad, Joseph, "A Return to Order Standard Grid Pitches in Advanced Electronic Assembly", Mar./Apr. 1997, Advanced Packaging's Guide to Emerging Technologies, pp. 8–10.

Brathwaite, NIC, "Contracting the Future An EMS Overview of Today's Emerging Technologies" Mar./Apr. 1997, Advanced Packaging's Guide to Engineering Technologies.

Boyd Corporation Sales Brochure, 8/96.

Primary Examiner—Carl J. Arbes
(74) Attorney, Agent, or Firm—Killworth, Gottman Hagan & Schaeff

(57) ABSTRACT

A spring element used in a temporary package for testing semiconductors is provided. The spring element is compressed so as to press the semiconductor, either in the form of a bare semiconductor die or as part of a package, against an interconnect structure. The spring element is configured so that it provides sufficient pressure to keep the contacts on the semiconductor in electrical contact with the interconnect structure. Material is added and/or removed from the spring element so that it has the desired modulus of elasticity. The shape of the spring element may also be varied to change the modulus of elasticity, the spring constant, and the force transfer capabilities of the spring element.

28 Claims, 5 Drawing Sheets

U.S. PATENT DOCUMENTS

| | | |
|---|---|---|
| 5,326,428 A | 7/1994 | Farnworth et al. |
| 5,402,004 A | 3/1995 | Ozmat |
| 5,402,077 A | 3/1995 | Agahdel et al. |
| 5,408,190 A | 4/1995 | Wood et al. |
| 5,418,469 A | 5/1995 | Turner et al. |
| 5,419,807 A | 5/1995 | Akram et al. |
| 5,459,352 A | 10/1995 | Layton et al. |
| 5,483,741 A | 1/1996 | Akram et al. |
| 5,495,179 A | 2/1996 | Wood et al. |
| 5,519,332 A | 5/1996 | Wood et al. |
| 5,541,525 A | 7/1996 | Wood et al. |
| 5,581,195 A | 12/1996 | Lee et al. |
| 5,639,247 A | 6/1997 | Johnson et al. |
| 5,726,580 A | 3/1998 | Wood et al. |
| 5,742,169 A | 4/1998 | Akram et al. |
| 5,783,461 A | 7/1998 | Hembree |
| 5,810,607 A | 9/1998 | Shih et al. |
| 5,815,000 A | 9/1998 | Farnworth et al. |
| 5,892,245 A | 4/1999 | Hilton |
| 5,913,687 A * | 6/1999 | Rathburn |
| 5,914,864 A | 6/1999 | Mac Donald |
| 5,926,029 A | 7/1999 | Ference et al. |
| 6,028,437 A | 2/2000 | Potter |
| 6,046,060 A | 4/2000 | Budnaitis |
| 6,046,911 A * | 4/2000 | Dranchak et al. |
| 6,060,894 A | 5/2000 | Hembree et al. |
| 6,062,873 A | 5/2000 | Kato |
| 6,062,879 A * | 5/2000 | Beaman et al. |
| 6,064,217 A | 5/2000 | Smith |
| 6,069,028 A | 5/2000 | Stroupe |
| 6,091,251 A | 7/2000 | Wood et al. |
| 6,093,468 A | 7/2000 | Toms et al. |
| 6,106,305 A | 8/2000 | Kozel et al. |
| 6,135,783 A * | 10/2000 | Rathburn |
| 6,229,320 B1 | 5/2001 | Haseyama et al. |

* cited by examiner

METHOD OF MAKING A SPRING ELEMENT FOR USE IN AN APPARATUS FOR ATTACHING TO A SEMICONDUCTOR

CROSS-REFERENCE TO RELATED APPLICATIONS

This is a divisional application of co-pending application Ser. No. 09/009,169 filed on Jan. 20, 1998 by David R. Hembree et al., entitled A SPRING ELEMENT FOR USE IN AN APPARATUS FOR ATTACHING TO A SEMICONDUCTOR AND A METHOD OF MAKING. This is application is further related to co-pending application Ser. No. 09/678,562, which is also a divisional of application Ser. No. 09/009,169.

BACKGROUND OF THE INVENTION

The present invention relates in general to spring elements, and, more particularly, to a spring element for use in an apparatus for attaching to a plurality of contacts of a semiconductor.

Unpackaged or bare semiconductor dies are used to construct multi-chip modules (MCMs) and other electronic devices. Unpackaged dies must be tested and burned in during the manufacturing process to certify each die as a known good die. This has led to the development of temporary packages that hold a single bare die for testing and burn-in. The temporary packages provide the electrical interconnection between the test pads on the die and external test circuitry. Exemplary temporary packages are disclosed in U.S. Pat. Nos. 5,302,891, 5,408,190 and 5,495,179 to Wood et al., which are herein incorporated by reference.

Typically, this type of temporary package includes an interconnect having contact members that make a temporary electrical connection with the test pads on the die. The temporary package can also include an attachment device that presses the die against the interconnect. The attachment device may include a clamping device that attaches to a package base and a spring element that presses the die against the interconnect. The configuration of the spring element is dependent on a number of factors. The spring element must be able to withstand relatively high compressive forces and relatively high burn-in temperatures without experiencing compression set. Further, the dimensions of the spring element must be such that it is compatible with the temporary package. Finally, the spring element must be able to withstand the amount of pressure required for pressing the die against the interconnect without causing an excessive amount of force to be transferred to the die, and thus damaging the same.

Accordingly, there is a need for a spring element which is compatible with the temporary packages and environment used to test and burn-in semiconductor. Preferably, such a spring element would be reusable and inexpensive to manufacture.

SUMMARY OF THE INVENTION

The present invention meets this need by providing a spring element having a modulus of elasticity which may be adjusted according to the required environment. Material may be removed from or added to the spring element to change the modulus of elasticity as needed. The shape of the spring element may also be varied to change the modulus of elasticity, the spring constant, and the force transfer capabilities of the spring element.

According to a first aspect of the present invention, a spring element comprises a first elastic member comprised of a first elastomeric material having a first modulus of elasticity. The first elastic member has a plurality of holes formed therein such that the spring element has an overall modulus of elasticity different from the first modulus of elasticity. The spring element may further comprise a second elastic member comprised of a second elastomeric material having a second modulus of elasticity. The second elastic member is positioned in at least one of the plurality of holes formed in the first elastic member such that the overall modulus of elasticity is different from the first and second moduli of elasticity. The spring element may further comprise a plurality of the second elastic members positioned in a plurality of the plurality of holes in the first elastic member. The first and second elastomeric materials may comprise silicone.

According to another aspect of the present invention, a spring element comprises a first elastic member comprised of silicone having a first modulus of elasticity and a plurality of second elastic members each comprised of silicone having a second modulus of elasticity. The plurality of second elastic members are positioned in each of a plurality of holes in the first elastic member such that the spring element has an overall modulus of elasticity different from the first and second moduli of elasticity.

According to yet another aspect of the present invention, a spring element comprises a first elastic member and a second elastic member. The first elastic member is comprised of a first elastomeric material having a first modulus of elasticity and the second elastic member is comprised of a second elastomeric material having a second modulus of elasticity. The second elastic member is positioned within the first elastic member such that the spring element has an overall modulus of elasticity different from the first and second moduli of elasticity. The spring element may further comprise a plurality of the second elastic members positioned within the first elastic member. The second elastic member may be substantially spherical or elongated. The first elastomeric material may comprise foam-like silicone while the second elastomeric material may comprise substantially solid silicone.

According to another aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element including a first elastic member comprised of a first elastomeric material having a first modulus of elasticity. A portion of the first elastomeric material is removed from the first elastic member such that the spring element has an overall modulus of elasticity different from the first modulus of elasticity.

According to a further aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element including a first elastic member comprised of a first elastomeric material having a first modulus of elasticity. The first elastic member has a plurality of holes formed therein such that the spring element has an overall modulus of elasticity different from the first modulus of elasticity. The semiconductor may comprise a semiconductor die or a semiconductor die formed within a semiconductor package. The semiconductor package may comprise a package selected from the group consisting of a chip-scale package, a ball grid array, a chip-on-board, a direct chip attach, and a flip-chip.

According to a still further aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element including a first elastic member comprised of silicone having a first modulus of elasticity and a plurality of second elastic members each comprised of silicone having a second modulus of elasticity. The first elastic member includes a plurality of holes formed therein with each of the plurality of holes receiving one of the plurality of second elastic members such that the spring element has an overall modulus of elasticity different from the first and second moduli of elasticity.

According to a yet still further aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element including an elastic member comprised of an elastomeric material having a modulus of elasticity. A hole is formed in the elastic member such that the spring element has an overall modulus of elasticity different from the modulus of elasticity of the elastomeric material. The elastic member is also shaped so as to engage an outer edge of the semiconductor such that a force applied by the attachment device as the interconnect structure is pressed against the semiconductor is substantially uniform around the semiconductor. The elastic member may be o-ring shaped and comprised of silicone.

According to another aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element including a first elastic member and a second elastic member. The first elastic member comprises a first elastomeric material having a first modulus of elasticity and the second elastic member comprises a second elastomeric material having a second modulus of elasticity. The second elastic member is positioned within the first elastic member such that the spring element has an overall modulus of elasticity different from the first and second moduli of elasticity.

According to yet another aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element comprised of a plurality of interwoven threads. The plurality of interwoven threads may comprise silicone.

According to a further aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element including an elastic member comprised of an elastomeric material having a modulus of elasticity. At least one cavity is formed in the elastic member such that the spring element has an overall modulus of elasticity different from the modulus of elasticity of the elastomeric material. The elastic member may have a plurality of cavities formed therein. The elastomeric material may be substantially solid.

According to a still further aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element including an elastic member having a variable spring constant. The elastic member may have a triangular or diamond shaped cross-section. The elastic member may have a repeating triangular or diamond shaped cross-section.

According to another aspect of the present invention, a method of making a spring element comprises providing a first elastic member comprised of a first elastomeric material having a first modulus of elasticity. A plurality of holes are formed in the first elastic member to adjust an overall modulus of elasticity of the spring element. The method may further comprise the step of adding a second elastic member comprised of a second elastomeric material having a second modulus of elasticity to one of the plurality of holes so that the overall modulus of elasticity is different from the first and second moduli of elasticity. The method may further comprise the step of adding a plurality of the second elastic members to a plurality of the plurality of holes in the first elastic member. The plurality of holes may be formed by punching, laser drilling or molding the first elastic member.

According to yet another aspect of the present invention, a method of making a spring element comprises providing a first elastic member comprised of a first elastomeric material having a first modulus of elasticity. A plurality of holes are wet drilled in the first elastic member to adjust an overall modulus of elasticity of the spring element.

According to a further aspect of the present invention, a method of making a spring element comprises providing a first elastic member comprised of a first elastomeric material having a first modulus of elasticity. A plurality of holes are wet drilled in the first elastic member to adjust an overall modulus of elasticity of the spring element. One of a plurality of second elastic members are then added to each of the plurality of holes. Each of the plurality of second elastic members is comprised of a second elastomeric material having a second modulus of elasticity such that an overall modulus of elasticity of the spring element is different from the first and second moduli of elasticity.

According to a still further aspect of the present invention, a method of making a spring element comprises providing a first elastic member comprised of a first elastomeric material having a first modulus of elasticity. A second elastic member composed of a second elastomeric material having a second modulus of elasticity is formed in the first elastic member such that the spring element has an overall modulus of elasticity different from the first and second moduli of elasticity. The method may further comprise the step of forming a plurality of the second elastic members within the first elastic member.

Accordingly, it is an object of the present invention to provide a spring element which is compatible with the temporary packages and environment used to test and burn-in semiconductors. It is another object of the present invention to provide a spring element which is reusable and inexpensive to manufacture. Other features and advantages of the invention will be apparent from the following description, the accompanying drawings, and the appended claims.

DETAILED DESCRIPTION OF THE PREFERRED EMBODIMENTS

Figure 1:
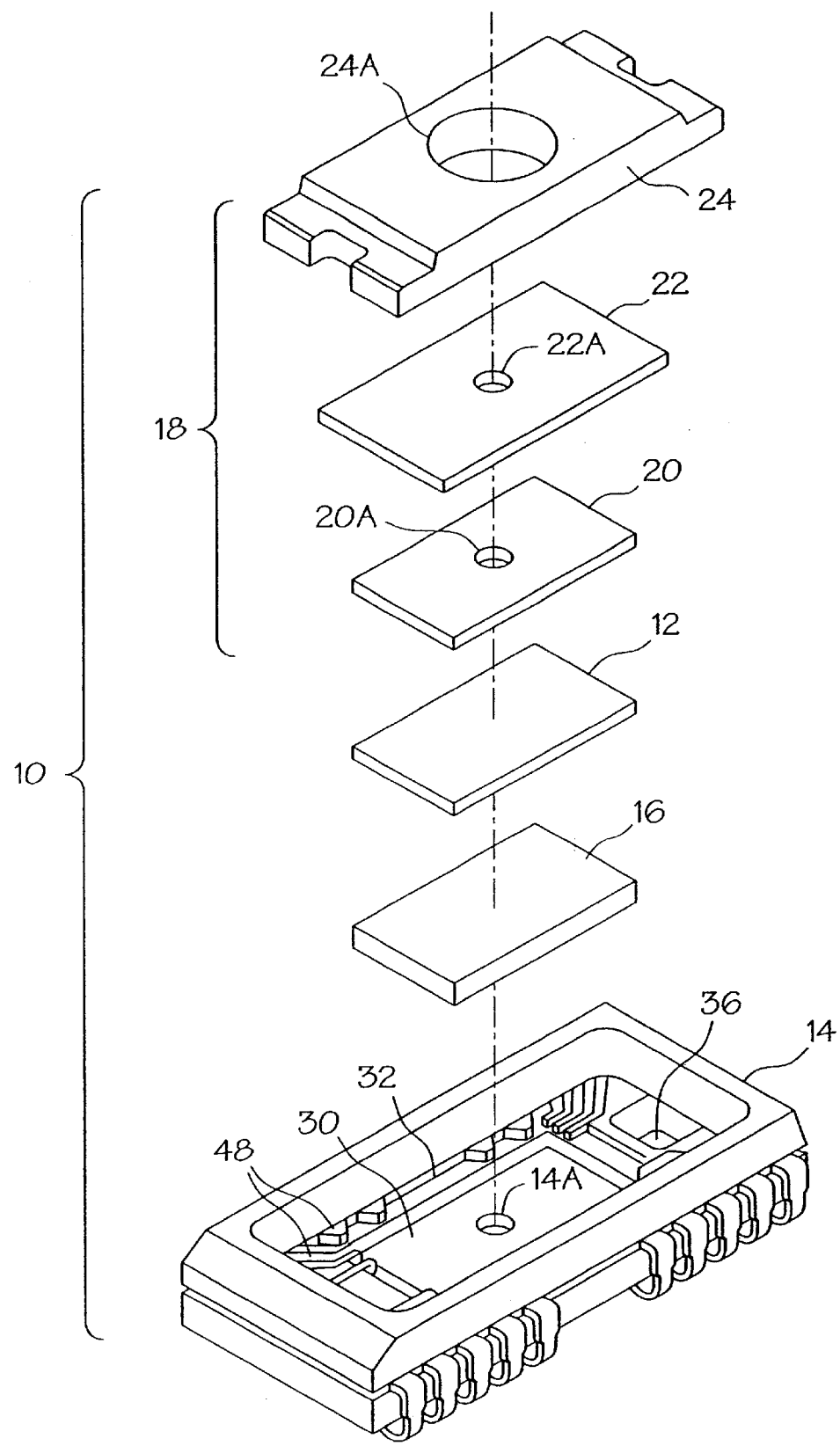
FIG. 1 is an exploded view of a temporary package for testing semiconductors.
Figure 2:
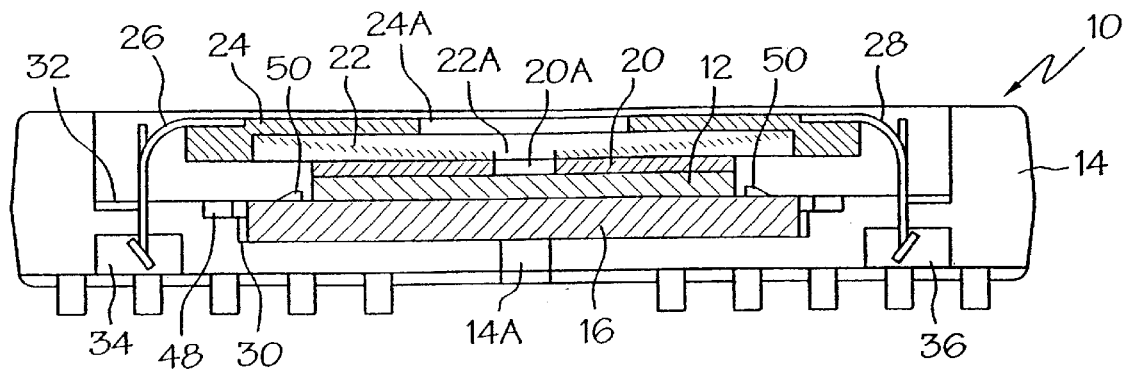
FIG. 2 is a cross-sectional view of the assembled temporary package shown in FIG. 1.

Referring now to FIGS. 1 and 2, a typical temporary package 10 used for testing a semiconductor 12 is shown. The temporary package 10 includes a package base 14, an interconnect structure 16, and an attachment device 18. The interconnect structure 16 establishes electrical communication between the package base 14 and the semiconductor 12. The attachment device 18 secures the semiconductor 12 to the package base 14 and presses the semiconductor 12 against the interconnect structure 16. The attachment device 18 includes a pressure plate 20, a spring element 22, a cover 24 and a pair of clips 26, 28.

The interconnect structure 16 is positioned within a recess 30 formed within the package base 14. The semiconductor 12 is positioned over the interconnect structure 16 and held within another recess 32 formed within the package base 14. The spring element 22 is secured to the cover 24 using an appropriate adhesive. However, it will be appreciated by those skilled in the art that the spring element 22 may used without being secured to the cover 24. The pressure plate 20 overlies the semiconductor 12 and is pressed against the semiconductor 12 by the spring element 22 and the cover 24. Accordingly, the semiconductor 12 is pressed against the interconnect structure 16 thereby establishing an electrical connection between the semiconductor 12, the interconnect structure 16 and the package base 14.

The cover 24 is secured to package base 14 by the clips 26, 28. The clips 26, 28 engage a top portion of the cover 24 and are secured to the package base 14 through corresponding openings 34, 36 in the package base 14. It will be appreciated by those skilled in the art that other types of latching mechanisms may be used to secure the cover 24 to the package base 14. The cover 24, the spring element 22, the pressure plate 20 and the package base 14 each include a central opening which are designated 24A, 22A, 20A and 14A, respectively. The openings 24A, 22A, 20A and 14A are used during assembly of the package 10 to permit the semiconductor 12 to be held by a vacuum tool (not shown) during optical alignment of the semiconductor 12 and the interconnect structure 16. The vacuum tool may also be used to disassemble the temporary package 10 as required.

Figure 3:
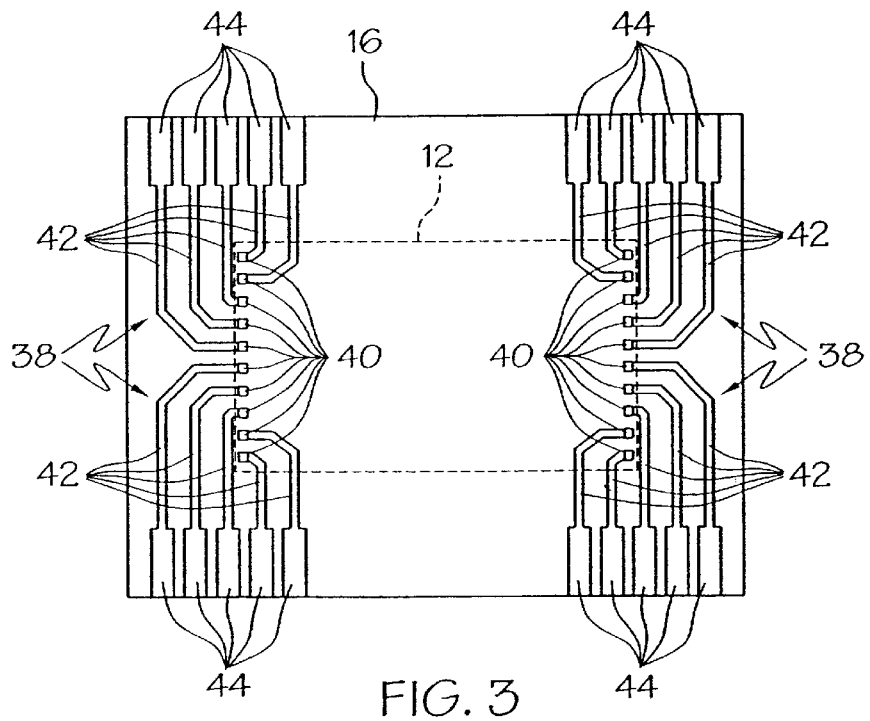
FIG. 3 is a plan view of an interconnect structure for testing semiconductor dies used in the temporary package of FIG. 1 according to first aspect of the present invention.
Figure 4:
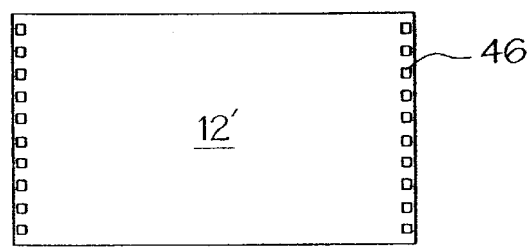
FIG. 4 is a schematic plan view of a semiconductor die to be tested in the temporary package of FIG. 1 according to the first aspect of the present invention.

The temporary package 10 may be used to test semiconductors 12 in a variety of forms. According to a first aspect of the present invention, the temporary package 10 is used to test bare semiconductor dies 12', see FIG. 4. The interconnect structure 16 is arranged so as to interface with such semiconductor dies 12'. Referring to FIG. 3, the interconnect structure 16 includes a plurality of conductors 38. Each of the plurality of conductors 38 includes a contact member 40, a connection line 42 and a bonding site 44. The contact members 40 are formed in a pattern which correspond to a plurality of contacts or bond pads 46 on the semiconductor die 12'; see also FIG. 4. The contact members 40 are adapted to contact and establish an electrical connection with the bond pads 46 on the semiconductor die 12'. For example, the contact members 40 may include a raised portion (not shown) which contacts the bond pads 46 as the semiconductor die 12' is pressed against the interconnect structure 16. The connection lines 42 terminate at the bonding sites 44 for connection to the package base 14. The bonding sites are connected to respective conductive traces 48 on the package base 14 using bond wires 50. The interconnect structure 16 may include a number of test structures (not shown) for evaluating various electrical characteristics of the interconnect structure 16. Once assembled, the semiconductor die 12' may be tested and burned-in as desired.

In the illustrated embodiment, the interconnect 16 is formed of a silicon substrate using conventional semiconductor technology. Similarly, the plurality of conductors 38 are formed of an appropriate conductive material using conventional semiconductor technology. The interconnect structure 16 may be formed according to U.S. Pat. Nos. 5,326,428; 5,419,807 and 5,483,741 which are herein incorporated by reference. In the illustrated embodiment, the semiconductor die 12' is formed of a silicon substrate with a number of additional semiconductor layers forming the desired semiconductor device using conventional semiconductor technology. It will be appreciated by those skilled in the art that the semiconductor die 12' may be formed of other semiconductor materials, such as gallium arsenide.

Figure 5:
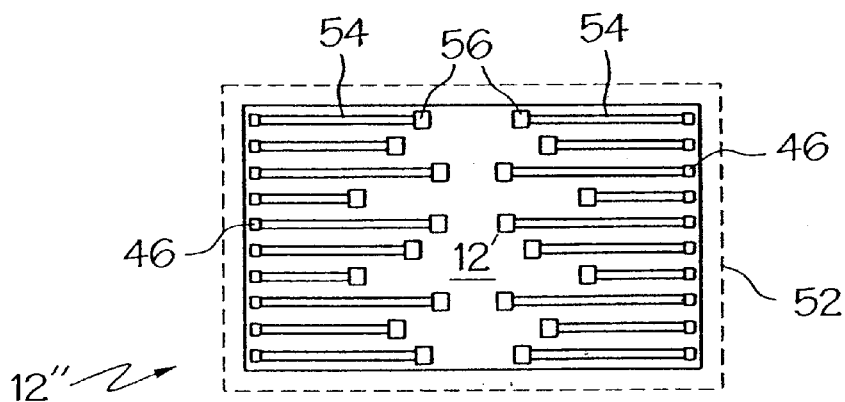
FIG. 5 is a schematic plan view of a semiconductor package to be tested in the temporary package of FIG. 1 according to a second aspect of the present invention.
Figure 6:
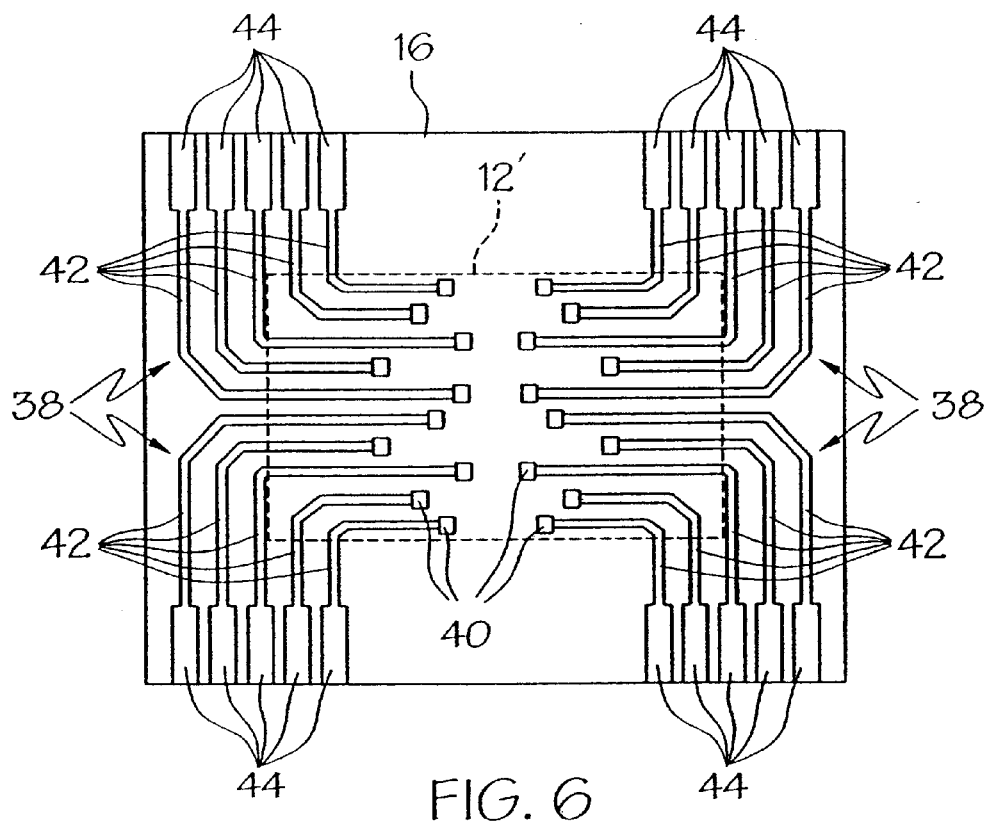
FIG. 6 is a plan view of an interconnect structure for testing semiconductor packages used in the temporary package of FIG. 1 according to the second aspect of the present invention.

According to a second aspect of the present invention, the temporary package 10 is used to test semiconductor packages 12"; see FIG. 5. The semiconductor package 12" includes at least one semiconductor die 12' and an additional structure 52. The structure 52 basically reroutes the bond pads 46 from the edge of the semiconductor die 12' towards the center of the semiconductor die 12'. This rerouting reduces the precision required for aligning the bond pads 46 with the contact members 40 as there is a greater area in which to position the bond pads 46. The structure 52 includes a plurality of conductive traces 54 electrically coupled to respective bond pads 46. The traces 54 are routed toward the center of the semiconductor die 12' in any desired pattern. The end of each trace 54 includes bonding member 56, such a solder ball. The bonding member 56 is typically larger than the corresponding bond pad 46 such that the precision in aligning the contact members 40 with the bonding member 56 is reduced. The semiconductor package 12" may comprise a chip-scale package (CSP), ball grid array (BGA), chip-on-board (COB), direct chip attach (DCA), flip-chips and other similar packages. As shown in FIG. 6, the interconnect structure 16 is arranged and configured to interface with the semiconductor package 12" as is known in the art. It should be apparent from the above description that the semiconductor 12 may comprise bare semiconductor dies 12' and semiconductor dies arranged in packages, such as semiconductor packages 12" as is known in the art.

The spring element 22 is composed of an elastomeric material. In the illustrated embodiment, the elastomeric material comprises silicone as it is compatible with the high temperatures associated with burn-in. However, silicone and the silicon used to form the semiconductor 12 tend to bond together due to surface attraction and the compressive forces encountered as the semiconductor 12 is pressed against the interconnect structure 16. Such a bond could damage the underlying structures of the semiconductor 12 as well as the semiconductor 12 itself as the semiconductor 12 and the spring element 22 are separated. The pressure plate 20 acts as an interface between the semiconductor 12 and the spring element 22 to prevent such a bond from forming. The pressure plate 20 is thus composed of a suitable material which is compatible with the spring element 22 and the semiconductor 12 so as to prevent a bond from forming between any of the aforementioned structures. It will be appreciated by those skilled in the art that spring element 22 may be composed of other elastomeric materials, such as appropriate urethanes and polyesters. Further, the pressure plate 20 may be omitted if the material used to form the spring element 22 does not bond to the semiconductor 12 when subjected to high pressure and temperature.

Typically, the semiconductor 12 and the temporary package 10 are relatively small thereby limiting the area or thickness of the spring element 22. The thickness of the spring element 22 may range between approximately 15 mils (0.381 mm) to approximately 125 mils (3.177 mm). However, it will be appreciated by those skilled in the art that the spring element 22 may be any desired thickness depending on the particular package 10 and semiconductor 12. The spring element 22 absorbs some of the force or pressure applied to it as it is compressed by the cover 24. The spring element 22 is sized and configured to transfer a desired amount of pressure to the semiconductor 12. A sufficient amount of pressure needs be applied to the semiconductor 12 so that it properly engages the interconnect structure 16. However, an excessive amount of pressure could damage the semiconductor 12 and the interconnect structure 16. As the dimensions of the spring element 22 are limited due to the size of the semiconductor 12 and the package 10, the configuration of the spring element 22 may be changed so that it exhibits the desired pressure absorption and force transfer characteristics.

The force applied by the spring element 22 may be changed by changing the area of the spring element 22 to be compressed. For example, a pressure plate 20 which is larger than the outer dimensions of the semiconductor 12 may be used with a lower psi spring element 22. The larger pressure plate 20 limits the overall compression height of the spring element 22 while applying the appropriate amount of force. Reducing the amount that the spring element 22 is compressed lessens the compression set of the spring element 22.

One feature of the spring element 22 which may be changed is its modulus of elasticity. Lowering the modulus of elasticity of the spring element 22 would enable it to absorb more force or pressure so that the amount of pressure applied to the semiconductor 12 is within acceptable levels. Another way of describing such function is forming low psi (lbs. per square inch) materials from high psi materials. Conversely, the modulus of elasticity may be increased so as to lessen the amount of force or pressure absorbed by the spring element 22 and thus increase the amount of force or pressure applied to the semiconductor 12.

Figure 7:
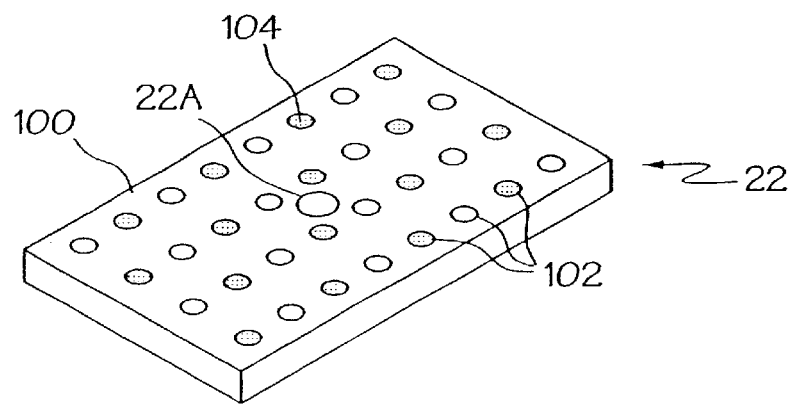
FIG. 7 is a perspective view of a spring element according to a first embodiment of the present invention.

Referring now to FIG. 7, the spring element 22 according to a first embodiment of the present invention is shown. The spring element 22 comprises a first elastic member 100 comprised of a first elastomeric material having a first modulus of elasticity. In the illustrated embodiment, the first elastomeric material comprises silicone. The silicone may be substantially solid or foam-like by having gas bubbles blown through it during fabrication using conventional methods. It should be apparent that the first modulus of elasticity is dependent, in part, on the configuration of the silicone as being foam-like or substantially solid. Foam-like material is more easily compressed than substantially solid material as the gas bubbles in the foam-like material are more easily compressible. A plurality of openings 102 are formed in the first elastic member 100 in addition to the opening 22A described above. The plurality of openings 102 may extend partially or completely through the first elastic member 100. The plurality of openings 102 are formed by wet drilling the first elastic member 100. Wet drilling is particularly advantageous as it will not leave residual oil or particles from the silicone on the first elastic member 100. The plurality of openings 102 may also be formed using other appropriate methods, such as by molding, regular drilling, laser drilling or by punching out the desired openings. An overall modulus of elasticity of the spring element 22 is thus dependent on the size and total number of openings 102 through the first elastic member 100. The overall modulus of elasticity of the spring element 22 is lower than the first modulus of elasticity of the first elastic member 100 in direct relation to the quantity of first elastomeric material removed from the first elastic member 100. The spring element 22 is thus more compressible.

The overall modulus of elasticity of the spring element 22 may be further changed by adding one or more second elastic members 104 to the first elastic member 100. The second elastic members 104 are comprised of a second elastomeric material having a second modulus of elasticity different from the first modulus of elasticity. The second elastic members 104 may be positioned in one or more of the openings 102 as desired. In the illustrated embodiment, the second elastic members 104 also comprise silicone which may be substantially solid or foam-like. The overall modulus of elasticity of the spring element 22 with the second elastic members 104 in the openings 102 will be at least greater than the overall modulus of elasticity of the spring element 22 with empty openings 102. Further, the overall modulus of elasticity of the spring element 22 may be greater than the first modulus of elasticity if the second elastomeric material is stiffer or more dense than the first elastomeric material.

Figure 8:
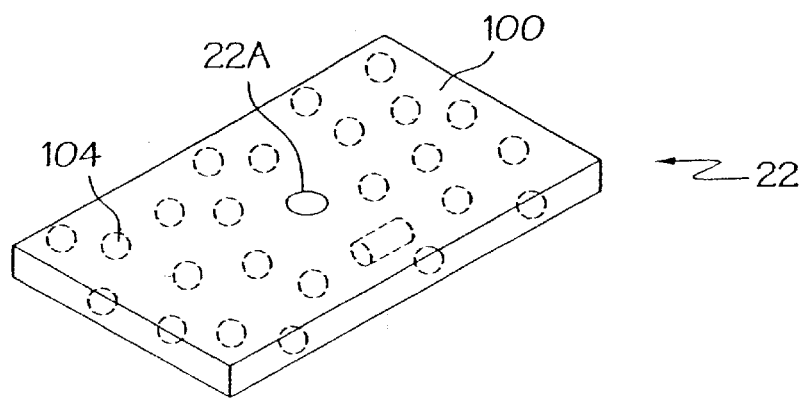
FIG. 8 is perspective view of a spring element according to a second embodiment of the present invention.

Referring now to FIG. 8, the spring element 22 according to a second embodiment of the present invention is shown, with like reference numerals corresponding to like elements. In this embodiment, one or more of the second elastic members 104 are positioned within the first elastic member 100. The second elastic members 104 are formed with the first elastic member 100 as the first elastic member 100 is fabricated. As with the first embodiment, the overall modulus of elasticity is dependent on the number and size of the second elastic members 104. The second elastic members 104 may have any desired shape. In the illustrated embodiment, the second elastic members 104 are generally spherical or oblong. The second elastic members 104 may be foam-like or substantially solid depending on the desired properties of the spring element 22.

Figure 9:
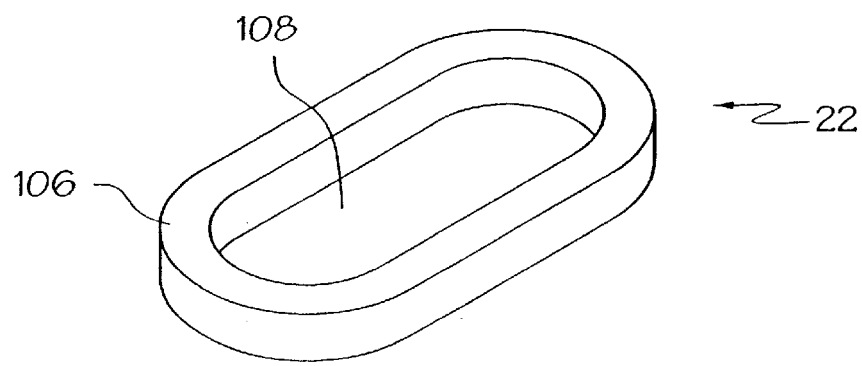
FIG. 9 is perspective view of a spring element according to a third embodiment of the present invention.

Referring now to FIG. 9, the spring element 22 according to a third embodiment of the present invention is shown. The spring element 22 comprises an elastic member 106 comprised of an elastomeric material having a modulus of elasticity. The elastic member 106 is shaped so that it engages an outer edge of the semiconductor 12 as it presses the semiconductor 12 against the interconnect structure 16. The spring element 22 of this embodiment includes a relatively large hole 108 through the elastomeric material such that the overall modulus of elasticity of the spring element 22 is different from the modulus of elasticity of the elastic member 106. As the spring element 22 engages the outer edge of the semiconductor 12, the force or pressure from the compressed spring element 22 is substantially uniform around the semiconductor 12. By engaging only the outer edge of the semiconductor 12, the applied force or pressure from the spring element 22 is substantially uniform compared to a sheet in which more force or pressure is applied to the center than the edges. In the illustrated embodiment, the elastic member 106 is o-ring shaped.

Figure 10:
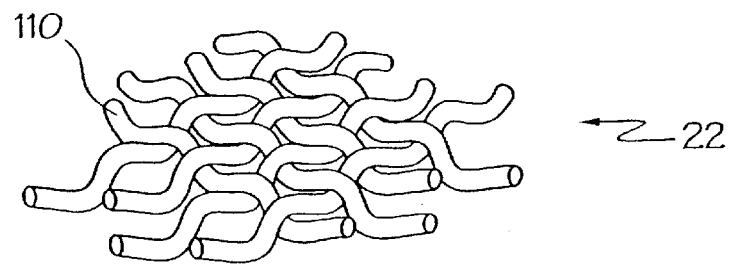
FIG. 10 is perspective view of a spring element according to a fourth embodiment of the present invention.

Referring now to FIG. 10, the spring element 22 according to a fourth embodiment of the present invention is shown. The spring element 22 comprises a plurality of interwoven threads 110. The amount in which the spring element of the fourth embodiment may be compressed is dependent, in part, to the size and the degree in which the threads 110 are woven together. The threads 110 are comprised of an elastomeric material which is silicone in the illustrated embodiment.

Figure 11:
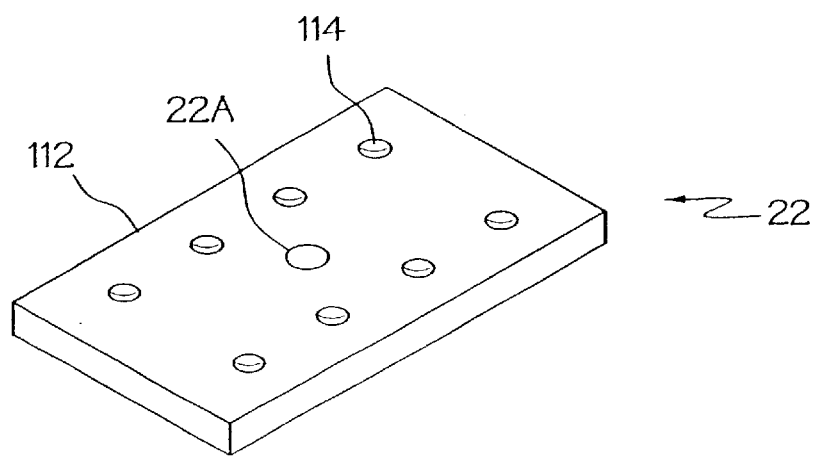
FIG. 11 is perspective view of a spring element according to a fifth embodiment of the present invention.

Referring now to FIG. 11, the spring element 22 according to a fifth embodiment of the present invention is shown. The spring element 22 comprises an elastic member 112 comprised of an elastomeric material having a modulus of elasticity. One or more cavities or dimples 114 are formed in the elastic member 112. The overall modulus of elasticity of the spring element 22 is thus dependent on the size and number of cavities 114. The cavities 114 may be formed by molding them into the elastic member 112 or by cutting cavities out of the elastic member 112. The cavities 114 may comprise any desired shape.

Figure 12:
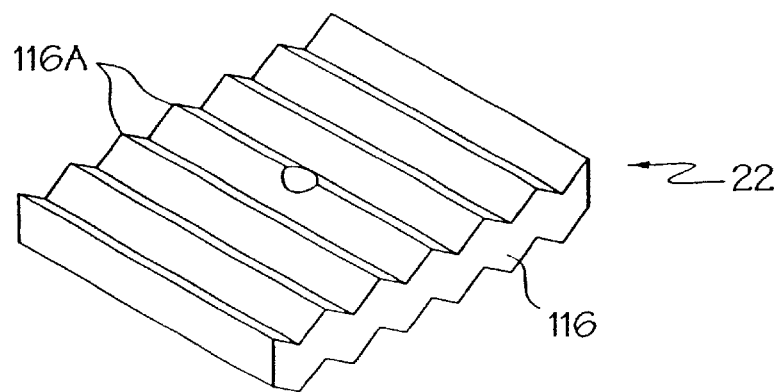
FIG. 12 is perspective view of a spring element according to a sixth embodiment of the present invention.

Referring now to FIG. 12, the spring element 22 according to a sixth embodiment of the present invention is shown. The spring element 22 comprises an elastic member 116 having a variable spring constant. The elastic member 116 has a repeating diamond shaped cross-section with a set of first peaks 116A and a set of second peaks 116B. The spring constant of the elastic member 116 changes based on the level of compression. The spring constant increases in direct proportion to the level of compression. The spring constant increases with compression because a greater amount of material is compressed. As there is less material near the peaks 116A, 116B, the amount of material compressed is less such that the spring constant is low. However, as compression increases, the amount of material compressed also increases such that the spring constant is higher. The elastic member 116 may have different shapes provided that the spring constant changes with the degree of compression. The elastic member 116 may have a triangular cross-section or a repeating triangular shaped cross-section. The elastic member 116 may be formed by molding or extruding an appropriate elastomeric material. The elastomeric material may be substantially solid or foam-like.

It will be appreciated by those skilled in the art that the spring element 22 may have any combination of the above embodiments. The final configuration of the spring element 22 will be dependent on the desired physical properties of the spring element 22 as well as the dimensional limitations for each particular package 10 and semiconductor 12. It will be further appreciated by those skilled in the art that the spring element 22 may be used with other temporary packages.

Having described the invention in detail and by reference to preferred embodiments thereof, it will be apparent that modifications and variations are possible without departing from the scope of the invention defined in the appended claims.

What is claimed is:

1. A method of making a spring comprising:
   providing a first elastic member comprised of a first elastomeric material having first force transfer characteristics, said first elastic member defining a spring element;
   sizing said spring element so as to be insertable between a cover and a package base of a temporary package; and,
   forming a plurality of holes in said first elastomeric material, each of said plurality of holes being formed at least partially through said elastomeric member so as to adjust the overall force transfer characteristics of said spring element, wherein the quantity and size of said plurality of holes is selected such that said spring element transfers a predetermined amount of force as said spring element is compressed within said temporary package.

2. The method of claim 1, further comprising adding a second elastic member comprised of a second elastomeric material having second force transfer characteristics to one of said plurality of holes, said overall force transfer characteristics being different from said first and second force transfer characteristics.

3. The method of claim 2, further comprising adding a plurality of said second elastic members to said spring element such that each second elastic member is positioned within a select one of said plurality of holes in said first elastic member.

4. The method of claim 1, wherein said first elastic member comprises silicone.

5. The method of claim 1, wherein forming a plurality of holes in said first elastic member to adjust overall force transfer characteristics of said spring element comprises punching said plurality of holes in said first elastic member.

6. The method of claim 1, wherein forming a plurality of holes in said first elastic member to adjust overall force transfer characteristics of said spring element comprises drilling said plurality of holes in said first elastic member.

7. The method of claim 1, wherein forming a plurality of holes in said first elastic member to adjust overall force transfer characteristics of said spring element comprises molding said plurality of holes in said first elastic member.

8. The method of claim 1, wherein said plurality of holes penetrate less than a thickness of said first elastomeric material defining cavities therein.

9. The method of claim 1, wherein at least a portion of said plurality of holes are through holes.

10. A method of making a spring comprising:
providing a first elastic member comprised of a first elastomeric material having first force transfer characteristics, defining a spring element;
sizing said spring element so as to be insertable between a cover and a package base of a temporary package;
wet drilling a plurality of holes in said first elastic member to adjust overall force transfer characteristics of said spring element; and
adding at least one second elastic member to a select one of said plurality of holes, each second elastic member being comprised of a second elastomeric material having second force transfer characteristics such that overall force transfer characteristics of said spring element are different from said first and second force transfer characteristics, wherein the quantity and size of said plurality of holes, and the quantity of said at least one second elastic member is selected such that said spring element transfers a predetermined amount of force to said semiconductor device as said spring element is compressed within said temporary package.

11. A method of making a spring comprising:
providing a first elastic member comprised of a first elastomeric material having first force transfer characteristics, defining a spring element;
sizing said spring element so as to be insertable between a cover and a package base of a temporary package; and
forming at least one second elastic member composed of a second elastomeric material having second force transfer characteristics in said first elastic member such that said spring element has overall force transfer characteristics different from said first and second force transfer characteristics, wherein the quantity and size of said second elastic members is selected such that said spring element transfers a predetermined amount of force as said spring element is compressed within said temporary package.

12. The method of claim 11, further comprising forming a plurality of said second elastic members within said first elastic member.

13. The method of claim 11, wherein said second elastic member is substantially spherical.

14. The method of claim 11, wherein said second elastic member is elongated.

15. The method of claim 11, wherein said first elastomeric material comprises silicone.

16. The method of claim 11, wherein said first elastomeric material comprises foam-like material.

17. The method of claim 11, wherein said second elastomeric material comprises silicone.

18. The method of claim 11, wherein said silicone is substantially solid.

19. A method of making a spring comprising:
providing an elastic member comprised of a first elastomeric material having a cross-section defined by at least one peak, wherein said elastic member exhibits a variable spring constant that changes with a degree of compression of said at least one peak and defines a spring element; and
sizing said spring element so as to be insertable between a cover and a package base of a temporary package, wherein said spring element is arranged so as to transfer a predetermined amount of force as said spring element is compressed within said temporary package.

20. The method of claim 19, wherein said elastic member is provided by forming said first elastomeric material to have a triangular shaped cross-section.

21. The method of claim 19, wherein said elastic member is provided by forming said first elastomeric material to have a repeating triangular shaped cross-section.

22. The method of claim 19, wherein said elastic member is provided by forming said first elastomeric material to have a diamond shaped cross-section.

23. The method of claim 19, wherein said elastic member is provided by forming said first elastomeric material to have a repeating diamond shaped cross-section.

24. A method of making a spring comprising:
providing an elastic member comprised of an elastomeric material arranged as a plurality of interwoven threads, said elastomeric material defining a spring element; and
sizing said spring element so as to be insertable between a cover and a package base of a temporary package, wherein said spring element is arranged so as to transfer a predetermined amount of force as said spring element is compressed within said temporary package.

25. The method of claim 24, wherein said plurality of interwoven threads comprise silicone.

26. A method of making a spring comprising:
providing an elastic member comprised of a first elastomeric material having first force transfer characteristics;
forming at least one cavity in a surface of said first elastomeric material such that said elastic member has overall force transfer characteristics different from said first force transfer characteristics, wherein said elastic member defines a spring element and said at least one cavity extends less than entirely through said elastomeric material; and
sizing said spring element so as to be insertable between a cover and a package base of a temporary package, wherein the size of each cavity is selected so as to transfer a predetermined amount of force as said spring element is compressed within said temporary package.

27. The method of claim 26, wherein said elastic member has a plurality of cavities formed therein.

28. The method of claim 26, wherein said elastomeric material is substantially solid.

* * * * *